United States Patent
Tsuchiyama et al.

(10) Patent No.: US 10,131,824 B2
(45) Date of Patent: Nov. 20, 2018

(54) ADHESIVE COMPOSITION, ADHESIVE SHEET, AND METHOD FOR PRODUCING SEMICONDUCTOR DEVICE

(71) Applicant: Lintec Corporation, Tokyo (JP)

(72) Inventors: Sayaka Tsuchiyama, Tokyo (JP); Isao Ichikawa, Tokyo (JP)

(73) Assignee: LINTEC Corporation, Tokyo (JP)

( * ) Notice: Subject to any disclaimer, the term of this patent is extended or adjusted under 35 U.S.C. 154(b) by 83 days.

(21) Appl. No.: 14/906,284

(22) PCT Filed: Aug. 1, 2014

(86) PCT No.: PCT/JP2014/070364
§ 371 (c)(1),
(2) Date: Jan. 20, 2016

(87) PCT Pub. No.: WO2015/016352
PCT Pub. Date: Feb. 5, 2015

(65) Prior Publication Data
US 2016/0160094 A1    Jun. 9, 2016

(30) Foreign Application Priority Data
Aug. 2, 2013 (JP) ................................. 2013-161694

(51) Int. Cl.
| | | |
|---|---|---|
| *C09J 133/00* | (2006.01) | |
| *C09J 163/00* | (2006.01) | |
| *C09J 175/04* | (2006.01) | |
| *H01L 21/683* | (2006.01) | |
| *C09J 133/06* | (2006.01) | |
| *H01L 23/00* | (2006.01) | |
| *C08G 18/80* | (2006.01) | |
| *C08L 33/06* | (2006.01) | |
| *C09J 7/22* | (2018.01) | |
| *C09J 7/30* | (2018.01) | |
| *C08F 220/20* | (2006.01) | |

(52) U.S. Cl.
CPC ........ *C09J 133/00* (2013.01); *C08G 18/8022* (2013.01); *C08L 33/06* (2013.01); *C09J 7/22* (2018.01); *C09J 7/30* (2018.01); *C09J 133/066* (2013.01); *C09J 163/00* (2013.01); *C09J 175/04* (2013.01); *H01L 21/6836* (2013.01); *H01L 24/29* (2013.01); *C08F 220/20* (2013.01); *C08G 2170/40* (2013.01); *C09J 2203/326* (2013.01); *C09J 2433/00* (2013.01); *C09J 2463/00* (2013.01); *H01L 24/83* (2013.01); *H01L 2221/6834* (2013.01); *H01L 2221/68327* (2013.01); *H01L 2221/68336* (2013.01); *H01L 2221/68377* (2013.01); *H01L 2224/2919* (2013.01)

(58) Field of Classification Search
None
See application file for complete search history.

(56) References Cited

U.S. PATENT DOCUMENTS

| | | | |
|---|---|---|---|
| 2003/0069331 A1 | 4/2003 | Teiichi et al. | |
| 2014/0342121 A1* | 11/2014 | Taguchi | G02B 1/105 428/141 |
| 2016/0086908 A1* | 3/2016 | Tsuchiyama | C09J 7/0239 438/113 |

FOREIGN PATENT DOCUMENTS

| | | | |
|---|---|---|---|
| CN | 104955912 A | | 9/2015 |
| JP | 07216336 | * | 8/1995 |
| JP | 2007314604 A | | 12/2007 |
| JP | 200924162 A | | 2/2009 |
| JP | 2009292888 A | | 12/2009 |
| JP | 201174380 A | | 4/2011 |
| JP | WO 2013/081145 A1 | * | 6/2013 |
| JP | WO 2014/192745 | * | 12/2014 |
| WO | 2007119884 A1 | | 10/2007 |

OTHER PUBLICATIONS

JP 07216336 Machine translation.*
JP 2009292888 Machine translation.*
English Abstract of CN 104955912.
English Abstract of JP 2007314604.
English Abstract of JP 200924162.
English Abstract of JP 2009292888.
English Abstract of JP 201174380.
English Abstract of WO 2007119884.

* cited by examiner

Primary Examiner — Ana L. Woodward
(74) Attorney, Agent, or Firm — Cahn & Samuels, LLP

(57) ABSTRACT

An adhesive composition includes an acrylic polymer (A) having a weight-average molecular weight (Mw) of 350,000 or higher obtained by polymerizing an acrylic monomer by living radical polymerization using an organotellurium-containing compound as the polymerization initiator, an epoxy thermosetting resin (B), and a thermosetting agent (C). The adhesive composition is capable of joining with sufficient adhesive strength and capable of achieving high package reliability in a semiconductor device.

12 Claims, No Drawings

ADHESIVE COMPOSITION, ADHESIVE SHEET, AND METHOD FOR PRODUCING SEMICONDUCTOR DEVICE

This application is a U.S. national stage application of PCT/JP2014/070364 filed on 1 Aug. 2014 and claims priority to Japanese patent document 2013-161694 filed on 2 Aug. 2013, the entireties of which are incorporated herein by reference.

TECHNICAL FIELD

The present invention relates to an adhesive composition particularly suited to be used during a step of die bonding a semiconductor element (semiconductor chip) to an organic substrate or lead frame, and a step of dicing a silicon wafer or so and die bonding the semiconductor chip to the organic substrate or lead frame; and the present invention also relates to an adhesive sheet comprising an adhesive layer comprising the adhesive composition, and to a method for producing a semiconductor device using said adhesive sheet.

DESCRIPTION OF THE RELATED ART

The semiconductor wafer such as silicon and gallium-arsenide or so is produced in a large diameter, and this wafer is cut and separated (dicing) into small pieces of the element (the semiconductor chip), then moves on to the mounting step which is the subsequent step. At this time, the semiconductor wafer is adhered on the adhesive sheet in advance and the steps of dicing, washing, drying, expanding, and picking up are carried out, then moves on to the bonding step which is the subsequent step.

Among these steps, in order to simplify the processes of the picking up step and the bonding step, various dicing-die bonding adhesive sheets which comprises both of the wafer fixing function and the die adhesive function are proposed (refer to the patent article 1). The adhesive sheet disclosed in the patent article 1 enables the so-called direct die bonding, and allows omitting the coating step of the die adhering adhesive agent.

The property required against the recent semiconductor device is extremely severe. For example, in regards with the connection of the electrical parts, the surface mounting method (reflow) wherein the entire package is exposed to a high temperature which is higher than the melting point of the soldering is being carried out. Further, recently, due to the transition to the soldering which does not include lead, the mounting temperature has increased to 260° C. or so. Therefore, the stress generated inside the semiconductor package during the mounting has become larger than before, hence the chances of causing problems such as a peeling or package cracking at the adhesive boundary have increased.

Patent article 1 proposes the adhesive composition comprising an acrylic polymer having a weight average molecular weight (Mw) of 900,000 or more and a molecular distribution (Mw/Mn) of 7 or less, an epoxy based resin and a heat curing agent, wherein the main focus of the adhesive composition is to prevent the adhesion between the adhesive layer against each other after the dicing.

[Patent Article 1] JP Patent Application Laid Open No. 2009-292888

The present inventors have focused on regulating the molecular weight distribution of the acrylic polymer from the point of the polymerization method in order to attain the object of having high package reliability. The adhesive composition of the above mentioned patent article 1 makes the weight average molecular weight Mw larger in order to reduce the content of the low molecular weight component in relativity; thereby the plasticization of the adhesives caused by the low molecular weight component is prevented, and also prevents the adhesion between the adhesive layers against each other. However, the molecular weight distribution of the acrylic polymer used for the adhesives which is disclosed in the examples of the patent article 1 is around 4 or so which is relatively high; hence in order to sufficiently reduce the content of the low molecular weight component, the weight average molecular weight had to be as large as 1,000,000 or more.

As such, in case the weight average molecular weight of the acrylic polymer is high, it cannot follow the roughness of the chip surface which has become further finer in recent years, thus this may be a risk of causing the decline of the adhesive strength. Also, it is necessary to use the acrylic polymer having high weight average molecular weight, thus the degree of freedom for designing the adhesives is limited.

The object of the present invention is to provide the adhesive composition capable of bonding with sufficient adhesive strength and particularly capable of attaining high package reliability; and to provide the adhesive sheet comprising the adhesive layer comprising said adhesive composition, and to provide the method for producing the semiconductor device using said adhesive sheet.

SUMMARY OF INVENTION

The present invention which attains the above object includes the following gist.

(1) An adhesive composition comprising an acrylic polymer (A) having a weight average molecular weight (Mw) of 350,000 or more which is obtained by polymerizing an acrylic monomer by a living radical polymerization method using an organic tellurium compound as a polymerization initiator, an epoxy based heat curable resin (B) and a heat curing agent (C).

(2) The adhesive composition as set forth in (1) further comprising a cross-linking agent (D), and said acrylic polymer (A) comprises a functional group which reacts with said cross-linking agent.

(3) The adhesive composition as set forth in (2), wherein the cross-linking agent (D) comprises an isocyanate group, and the acrylic polymer (A) comprises a hydroxyl group.

(4) The adhesive composition as set forth in any one of (1) to (3), wherein the weight average molecular weight (Mw) of the acrylic polymer (A) is 900,000 or less.

(5) The adhesive composition as set forth in any one of (1) to (4), wherein a molecular weight distribution (Mw/Mn) of the acrylic polymer (A) is 3 or less.

(6) A single layer adhesive film comprising the adhesive composition as set forth in any one of (1) to (5).

(7) An adhesive sheet wherein an adhesive layer comprising the adhesive composition as set forth in any one of (1) to (5) is formed on a support.

(8) A method for producing a semiconductor device including steps of, adhering the adhesive layer of the adhesive sheet as set forth in (7) to a semiconductor wafer, dicing the semiconductor wafer to form a semiconductor chip, releasing the semiconductor chip from the support while the adhesive layer is transferred to the semiconductor chip, and adhering the semiconductor chip on a die pad part or on other semiconductor chip via said adhesive layer.

The Effect of the Invention

By using the adhesive sheet according to the present invention when fixing the semiconductor chip, it can be bonded with sufficient adhesive strength, and the semiconductor device showing high package reliability even under a harsh environment can be obtained.

DETAILED DESCRIPTION OF INVENTION

The Best Mode for Carrying Out the Invention

Hereinbelow, the adhesive composition, the adhesive sheet and the method for producing the semiconductor device using the sheet of the present invention will be described in detail.
(The Adhesive Composition)

The adhesive composition according to the present invention includes the acrylic polymer (A) (hereinafter, it may be referred as "(A) component". Same applies to other components as well), the epoxy based resin (B) (hereinafter, it may be referred as "compound (B)" or "(B) component"), and the heat curing agent (C) as the essential components; and other components may be included in order to improve various physical properties. Hereinafter, each component will be described in detail.
(A) Acrylic Polymer The weight average molecular weight (Mw) of the acrylic polymer (A) is 350,000 or more, and preferably less than 2,000,000; more preferably 400,000 to 1,800,000, further preferably 600,000 to 1,500,000, and particularly preferably 600,000 to 900,000. If the weight average molecular weight of the acrylic polymer is too low, the package reliability may be deteriorated due to the fluidity of the low molecular weight component of the adhesive layer. Also, if the weight average molecular weight of the acrylic polymer is too high, it may not be able to follow the roughness of the substrate or the chip surface, which may cause the voids or so. By having the weight average molecular weight of the acrylic polymer within the above mentioned range, the acrylic polymer comprises suitable flexibility, and the adhesive property of the adhesive layer against the adherend surface having high surface smoothness is improved, thereby the chip and the substrate, or the chip and the chip can be adhered strongly. Also, the decline of the package reliability caused by the low molecular weight component can be prevented. Further, by making the molecular weight distribution small, which will be described in below, the acrylic polymer (A) of the present invention can sufficiently reduce the content of the low molecular weight component without making the weight average molecular weight to be excessively large range.

The molecular weight distribution (Mw/Mn) of the acrylic polymer (A) is preferably 3 or less, more preferably 2 or less, further preferably 1.7 or less, and particularly preferably 1.5 or less. The acrylic polymer having the molecular weight distribution of 3 or less has small content of the low molecular weight component having high fluidity even when the weight average molecular weight is high because the molecular weight distribution is narrow; thus it tends allow preventing the decline of the package reliability caused by this low molecular weight component. The lower limit of the molecular weight distribution is 1.2 or so from the point of the compatibility of each component.

Note that, the values of the weight average molecular weight (Mw), the number average molecular weight (Mn) and the molecular weight distribution (Mw/Mn) of the acrylic polymer (A) is the value measured under the condition of the examples described in following using a gel permeation chromatography method (GPC method) (polystyrene standard). Also, in case of using the cross-linking agent (D), the weight average molecular weight (Mw), the number average molecular weight (Mn) and the molecular weight distribution (Mw/Mn) of the acrylic polymer (A) is the value prior to the reaction with the cross-linking agent (D).

The glass transition temperature (Tg) of the acrylic polymer is preferably −10° C. or more and 50° C. or less, more preferably 0° C. or more and 40° C. or less, and particularly preferably 0° C. or more and 30° C. or less. If the glass transition temperature is too low, the adhesive strength between the adhesive layer and the support becomes too large, and the pickup malfunction of the chip may occur. On the other hand, if the glass transition temperature is too high, the adhesive force of the adhesive layer for fixing the wafer may not be sufficient enough.

As the monomer constituting this acrylic polymer (A), at least (meth)acrylate monomer or the derivative thereof are included. As (meth)acrylate monomer or the derivative thereof, (meth)acrylic acid alkyl ester having alkyl group of carbon atoms of 1 to 18 such as methyl (meth)acrylate, ethyl (meth)acrylate, propyl (meth)acrylate, butyl (meth)acrylate or so may be mentioned; (meth)acrylate having cyclic back bone such as cycloalkyl ester (meth)acrylate, benzyl ester (meth)acrylate, isobornyl acrylate, dicyclopentanyl acrylate, dicyclopentenyl acrylate, dicyclopentenyloxyethyl acrylate, imide acrylate or so may be mentioned; acrylate comprising hydroxyl group such as 2-hydroxyethyl (meth)acrylate, 2-hydroxy propyl (meth)acrylate, 2-hydroxybutyl (meth)acrylate or so may be mentioned; (meth)acrylate comprising glycidyl group such as glycidyl (meth)acrylate or so may be mentioned; (meth)acrylate comprising amino group such as monoethylamino (meth)acrylate, diethylamino (meth)acrylate or so may be mentioned. Besides these, the acrylic polymer (A) may be copolymerized with the monomer comprising the carboxyl group such as (meth)acrylic acid, an itaconic acid or so, the monomer comprising the hydroxyl group other than (meth)acrylate such as vinyl alcohol, N-methylol(meth)acrylic amide or so, and (meth)acrylic amide, vinyl acetate, acrylonitrile, styrene or so.

In case the adhesive composition comprises the cross-linking agent (D), the acrylic polymer preferably comprises the functional group such as hydroxyl group, amino group, and carboxyl group or so which reacts with the cross-linking agent (D). By selecting the acrylate comprising the hydroxyl group, monoethylamino (meth)acrylate, (meth)acrylic acid or so which are mentioned in the above as the monomer constituting the acrylic polymer (A), the functional group which reacts with the cross-linking agent (D) can be introduced into the acrylic polymer. Particularly, the acrylate comprising the hydroxyl group is preferable because it can easily introduce the hydroxyl group into the acrylic polymer (A), and has good compatibility with the epoxy based resin (B), and also it can easily introduce the cross-linking structure using the cross-linking agent. Also, plurality of types of the acrylic polymer may be combined and used.

In case of introducing the functional group which reacts with the cross-linking agent (D) to the acrylic polymer (A) by using the monomer comprising the functional group which reacts with the cross-linking agent as the monomer constituting the acrylic polymer (A), the ratio of the weight of the monomer comprising the functional group which reacts with the cross-linking agent (D) is preferably 1 to 20 wt %, and more preferably 3 to 15 wt % with respect to the entire weight of the monomer constituting the acrylic polymer (A).

The acrylic polymer (A) as mentioned in the above is obtained by the method carrying out the living radical polymerization of said acrylic based monomer using the organic tellurium compound as the polymerization initiator (hereinafter it may be referred as "TERP polymerization method"). By using the living radical polymerization method, the molecular weight distribution (Mw/Mn) of the acrylic polymer (A) can be easily regulated, thus the reliability of the semiconductor device using the adhesive composition of the present invention can be improved. Also, by using TERP polymerization method, the controllability of the molecular weight is improved. Particularly, it is suited for obtaining the polymer with high molecular weight.

As the organic tellurium compound as such living radical polymerization initiator, the following is preferably used.

[Chemical formula 1]

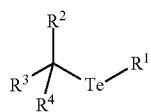

(1)

[In the chemical formula, $R^1$ is an alkyl group having the carbon atoms of 1 to 8, aryl group, substituted aryl group or aromatic heterocyclic group. $R^2$ and $R^3$ are hydrogen atom, or alkyl group having the carbon atoms of 1 to 8. $R^4$ is aryl group, substituted aryl group, aromatic heterocyclic group, acyl group, oxycarbonyl group or cyano group].

The group shown by $R^1$ is as described in following. As the alkyl group having the carbon atoms of 1 to 8, the alkyl group of a liner form, a branched chain form or cyclic form having the carbon atoms of 1 to 8 such as methyl group, ethyl group, n-propyl group, isopropyl group, cyclopropyl group, n-butyl group, sec-butyl group, tert-butyl group, cyclobutyl group, n-pentyl group, n-hexyl group, n-heptyl group, n-octyl group or so may be mentioned. As the preferable alkyl group, the alkyl group of linear form or branched chain form having the carbon atoms of 1 to 4 is preferable, and more preferably it is methyl group or ethyl group.

As for the aryl group, phenyl group, naphthyl group or so; as the substituted aryl group, phenyl group comprising the substituent group, naphthyl group comprising the substituent group or so; as the aromatic heterocyclic group, pyridyl group, furyl group, thienyl group or so may be mentioned. As the substituent group of the aryl group comprising the substituent group, for example halogen atom, hydroxyl group, alkoxy group, amino group, nitro group, cyano group, carbonyl containing group shown by —$COR^5$ ($R^5$=the alkyl group having the carbon atoms of 1 to 8, aryl group, alkoxy group having the carbon atoms of 1 to 8, and aryloxy group), sulfonyl group, trifluoromethyl group or so may be mentioned. As the preferable aryl group, phenyl group, trifluoromethyl substituted phenyl group may be mentioned. Also, preferably one or two of these substituent groups are substituted, and it is preferably at the para position or ortho position.

Each group shown by $R^2$ and $R^3$ are as described in the following. As the alkyl group having the carbon atoms of 1 to 8, the same alkyl groups described in above $R^1$ may be mentioned.

The group shown by $R^4$ may be as described in the following. As the aryl group, the substituted aryl group, and the aromatic heterocyclic group, the groups mentioned in the above $R^1$ may be mentioned. As the acyl group, formyl group, acetyl group, benzoyl group or so may be mentioned. As oxycarbonyl group, the group shown by —$COOR^6$ ($R^6$=H, alkyl group having the carbon atoms of 1 to 8, aryl group) is preferable, and for example, carboxyl group, methoxy carbonyl group, ethoxy carbonyl group, propoxy carbonyl group, n-butoxy carbonyl group, sec-butoxycarbonyl group, tert-butoxy carbonyl group, n-pentoxy carbonyl group, phenoxy carbonyl group or so may be mentioned. As the preferable oxy carbonyl group, methoxy carbonyl group, ethoxy carbonyl group may be mentioned.

As the group shown by $R^4$, the aryl group, the substituted aryl group and the oxycarbonyl group are preferable. As the aryl group, phenyl group is preferable. As the preferable substituted aryl group, halogen atom substituted phenyl group, trifluoromethyl substituted phenyl group are preferable. Also, in case of the halogen atom, one to five of these substituent groups are substituted. In case of the alkoxy group or trifluoromethyl group, one or two are preferably substituted. In case one is substituted, it is preferably at para position or ortho position, and in case two are substituted, it is preferably at the meta position. As the preferable oxy carbonyl group, methoxy carbonyl group, ethoxy carbonyl group may be mentioned.

As preferable tellurium containing compound shown by the above formula (1), $R^1$ is preferably the alkyl group having the carbon atoms of 1 to 4, $R^2$ and $R^3$ are preferably hydrogen atom or the alkyl group having the carbon atoms of 1 to 4, and $R^4$ is preferably aryl group, substituted aryl group, oxycarbonyl group. Particularly preferably, $R^1$ is preferably the alkyl group having the carbon atoms of 1 to 4, $R^2$ and $R^3$ are preferably hydrogen atom or the alkyl group having the carbon atoms of 1 to 4, and $R^4$ is preferably phenyl group, substituted phenyl group, methoxy carbonyl group, ethoxy carbonyl group.

As the specific tellurium containing compound shown by the above formula (1), it is as described in following. As the tellurium containing compound, (methyltellanyl-methyl) benzene, (1-methyltellanyl-ethyl) benzene, (2-methyltellanyl-propyl) benzene, 1-chloro-4-(methyltellanyl-methyl) benzene, 1-hydroxy-4-(methyltellanyl-methyl) benzene, 1-methoxy-4-(methyltellanyl-methyl) benzene, 1-amino-4-(methyltellanyl-methyl) benzene, 1-nitro-4-(methyltellanyl-methyl) benzene, 1-cyano-4-(methyltellanyl-methyl) benzene 1-methylcarbonyl-4-(methyltellanyl-methyl) benzene, 1-phenylcarbonyl-4-(methyltellanyl-methyl) benzene, 1-methoxycarbonyl-4-(methyltellanyl-methyl) benzene, 1-phenoxycarbonyl-4-(methyltellanyl-methyl) benzene, 1-sulfonyl-4-(methyltellanyl-methyl) benzene, 1-trifluoromethyl-4-(methyltellanyl-methyl) benzene, 1-chloro-4-(1-methyltellanyl-ethyl) benzene, 1-hydroxy-4-(1-methyltellanyl-ethyl) benzene, 1-methoxy-4-(1-methyltellanyl-ethyl) benzene, 1-amino-4-(1-methyltellanyl-ethyl) benzene, 1-nitro-4-(1-methyltellanyl-ethyl) benzene, 1-cyano-4-(1-methyltellanyl-ethyl) benzene, 1-methylcarbonyl-4-(1-methyltellanyl-ethyl) benzene, 1-phenylcarbonyl-4-(1-methyltellanyl-ethyl) benzene, 1-methoxycarbonyl-4-(1-methyltellanyl-ethyl) benzene, 1-phenoxycarbonyl-4-(1-methyltellanyl-ethyl) benzene, 1-sulfonyl-4-(1-methyltellanyl-ethyl) benzene, 1-trifluoromethyl-4-(1- methyltellanyl-ethyl) benzene[1-(1-methyltellanyl-ethyl)-4-trifluoromethyl benzene, 1-3,5-bis-trifluoromethyl benzene], 1-(1-methyltellanyl-ethyl)3,5-bis-trifluoromethyl benzene, 1,2,3,4,5,-pentafluoro-6-(1-methyltellanyl-ethyl) benzene, 1-chloro-4-(2-methyltellanyl-propyl) benzene, 1-hydroxy-4-(2-methyltellanyl-propyl) benzene, 1-methoxy-4-(2-methyltellanyl-propyl) benzene, 1-amino-4-(2-methyltellanyl-propyl) benzene, 1-nitro-4-(2-methyltellanyl-propyl) benzene, 1-cyano-4-(2-methyltellanyl-propyl) benzene, 1-methylcarbonyl-4-(2-methyltellanyl-propyl) benzene, 1-phenylcarbonyl-4-(2-methyltellanyl-propyl) benzene, 1-methoxycarbonyl-4-(2-methyltellanyl-propyl) benzene, 1-phenoxycarbonyl-4-(2-methyltellanyl-propyl) benzene, 1-sulfonyl-4-(2-methyltellanyl-propyl) benzene, 1-trifluoromethyl-4-(2-methyltellanyl-propyl) benzene, 2-(methyltellanyl-methyl) pyridine, 2-(1-methyltellanyl-ethyl) pyridine, 2-(2-methyltellanyl-propyl) pyridine, 2-methyl-2-methyltellanyl-propanal, 3-methyl-3-methyltellanyl-2-butanone, 2-methyltellanyl-methyl acetate, 2-methyltellanyl-methyl propionate, 2-methyltellanyl-2-methyl methyl propionate, 2-methyltellanyl-ethyl ethanoate, 2-methyltellanyl-ethyl propionate, 2-methyltellanyl-2-methyl ethyl propionate[ethyl-2-methyl-2-n-methyltellanyl-propionate], 2-(n-butyltellanyl)-2-methyl ethyl propionate [ethyl-2-methyl-2-butyltellanyl-propionate], 2-methyltellanyl acetonitrile, 2-methyltallanyl propionitrile, 2-methyl-2-methyltellanyl propionitirle, (phenyltellanyl-methyl) benzene, (1-phenyltellanyl-ethyl) benzene, (2-phenyltellanyl-propyl) benzene or so may be mentioned.

Also, the compounds wherein methyltellanyl, 1-methyltellanyl, 2-methyltellanyl part mentioned in the above changed to ethyltellanyl, 1-ethyltellanyl, 2-ethyltellanyl, butyltellanyl, 1-butyltellanyl, 2-butyltellanyl are all included as well. Preferably, (methyltellanyl-methyl) benzene, (1-methyltellanyl-ethyl) benzene, (2-methyltellanyl-propyl) benzene, 1-chloro-4-(1-methyltellanyl-ethyl) benzene, 1-trifluoromethyl-4-(1-methyltellanyl-ethyl) benzene[1-(1-methyltellanyl-ethyl)-4-trifluoromethyl benzene], 2-methyltellanyl-2-methylmethyl propionate, 2-methyltellanyl-2-methyl ethyl propionate[ethyl-2-methyl-2-methyltellanyl-propionate], 2-(n-butyltellanyl)-2-methyl ethyl propionate [ethyl-2-methyl-2-n-butyltellanyl-propionate], 1-(1-methyltellanyl-ethyl)-3,5-bis-trifluoromethyl benzene, 1,2,3,4,5-pentafluoro-6-(1-methyltellanyl-ethyl) benzene, 2-methyltellanylpropionitrile, 2-methyl-2-methyltellanyl-propionitrile, (ethyltellanyl-methyl) benzene, (1-ethyltellanyl-ethyl) benzene, (2-ethyltellanyl-propyl) benzene, 2-ethyltellanyl-2-methyl methyl propionate, 2-ethyltellanyl-2-methyl ethyl propionate, 2-ethyltellanylpropionitrile, 2-methyl-2-ethyltellanylpropionitrile, (n-butyltellanyl-methyl) benzene, (1-n-butyltellanyl-ethyl) benzene, (2-n-butyltellanyl-propyl) benzene, 2-n-butyltellanyl-2-methyl methyl propionate, 2-n-butyltellanyl-2-methyl-methyl ethyl propionate, 2-n-butyltellanylpropionitrile, 2-methyl-2-n-butyltellanylpropionitrile may be mentioned.

These tellurium containing compounds shown by the above formula (1) may be used alone or by combining two or more thereof. As the tellurium containing compound shown by the above formula (1), for example in case of using ethyl-2-methyl-2-methyltellanyl-propionate, it can be obtained by using the method disclosed in JP Patent Application Laid Open No. 2011-74380 as the synthesis method.

As for the polymerization step, in addition to the tellurium containing compound, azo based polymerization initiator may be added as the polymerization promotor. As the azo based polymerization initiator it is not particularly limited as long as it is an initiator used for the usual radical polymerization, and for example, 2,2'-azobis(isobutylnitrile) (AIBN), 2,2'-azobis(2-methylbutylonitrile) (AMBN), 2,2'-azobis(2,4-dimethylvaleronitrile) (ADVN), 1,1'-azobis(1-cyclohexanecarbonitrile) (ACHN), dimethyl-2,2'-azobisisobutylate (MAIB), 4,4'-azobis(4-cyanovalerianate) (ACVA), 1,1'-azobis(1-acetoxy-1-phenylethane), 2,2'-azobis(2-methylbutylaminde), 2,2'-azobis(4-methoxy-2,4-dimethylvaleronitrile), 2,2'-azobis(2-methylamidinopropane)dihydrochloride, 2,2'-azobis[2-(2-imidazoline-2-yl)propane], 2,2'-azobis[2-methyl-N-(2-hydroxyethyl)propione amide], 2,2'-azobis(2,4,4,-trimethylpentane), 2-cyano-2-propylazoformamide, 2,2'-azobis(N-butyl-2-methylpropione amide), 2,2'-azobis(N-cyclohexyl-2-methylpropione amide) or so may be mentioned. In case of using the above mentioned azo based polymerization initiator, it is preferably used in the ratio of 0.01 to 100 mol, more preferably 0.1 to 100 mol, and further preferably 0.1 to 5 mol with respect to 1 mol of the tellurium containing compound of formula (1) used as the polymerization initiator.

The method for forming the acrylic polymer (A) by the living radical polymerization is as follows. The mixture of the aforementioned monomers and the living radical polymerization initiator shown by the general formula (1), and if desired the azo based polymerization initiator are mixed in the container which is substituted by the inactive gas. Here, as the inactive gas, nitrogen, argon, helium or so may be mentioned. Preferably, argon and nitrogen are preferable. Particularly preferably, it is nitrogen. The used amount of the monomer and the living radical polymerization initiator shown by the general formula (1) may be appropriately regulated depending on the molecular weight or the molecular weight distribution of the target acrylic polymer (A). As the preferable used amount (the unit of the used amount is mol number), it is roughly the amount wherein the total sum, which is obtained by multiplying the molecular weight of each monomer with the used ratio, divided by the weight average molecular weight (Mw) of the target acrylic polymer (A), and in some cases the amount of 0.3 to 3 times or so of the value thereof is used.

The polymerization is usually carried out without the solvent; however the organic solvent generally used for the radical polymerization may be used. As the solvent which can be used, for example benzene, toluene, N,N-dimethylformamide (DMF), dimethylsulfoxide (DMSO), acetone, chloroform, tetrachloromethane, tetrahydrofuran (THF), ethyl acetate, trifluoromethylbenzene or so may be mentioned. Also, the aqueous solvent can be used, for example water, methanol, ethanol, isopropanol, n-butanol, ethylcellosolve, butylcellosolve, 1-methoxy-2-propanol or so may be mentioned. As the used amount of the solvent, for example 0.01 to 100 ml, preferably 0.05 to 10 ml, particularly preferably 0.05 to 0.5 ml is used with respect to 1 g of the monomer.

Next, the above mentioned mixture is stirred. The reaction temperature and the reaction time may be regulated depending on the molecular weight and the molecular weight distribution of the obtained acrylic polymer (A), however it is usually stirred at 60 to 150° C., for 5 to 100 hours. Preferably, it is stirred at 80 to 120° C. for 10 to 30 hours. The polymerization is usually carried out at the normal pressure, but it may be applied with the pressure or reduced with the pressure. After the reaction is completed, the target acrylic polymer (A) is purified if needed, by removing the used solvent by the usual method, or by removing the remaining monomer under reduced pressure, by a precipitation filtration, by re-precipitation, or by column separation or so. As for the reaction treatment, any treatment method can be carried out as long as it does not influence the product.

For example, for the acrylic polymer (A), in order to make the ratio of the low molecular weight component having the weight average molecular weight Mw of 50,000 or less included therein to be 0.1 wt % or less, the following separation method can be employed. First, the acrylic polymer (A) in the ratio of the 1 to 30 parts by weight or so in terms of the solid content is added into 100 parts by weight of lower alcohol such as methanol, ethanol, n-propanol, isopropanol or so, or of aliphatic hydrocarbons having the carbon atoms of 5 to 10 such as pentane, hexane, heptane or so, preferably in methanol or hexane; then stirred at the room temperature to form the precipitation. Next, this precipitation is carried out with the solid-liquid separation by the method of decantation or so, then washed with said lower alcohol or aliphatic hydrocarbon having the carbon atoms of 5 to 10, then it is used. By this separation method, the ratio of the low molecular weight component having the molecular weight Mw of 50,000 or less in the acrylic polymer (A) can be made to 0.1 wt % or less.

In this living radical method, by using this mixture of each monomer constituting the acrylic polymer (A), the acrylic polymer (A) of the random copolymer can be obtained. The random copolymer allows obtaining the copolymer which is consistent with the fraction (mol fraction) of the monomer used for the reaction regardless of the type of the monomer. By using the tellurium containing compound as the polymerization initiator, the molecular weight control and the molecular weight distribution control can be carried out under very mild condition. The molecular weight of the acrylic polymer (A) can be regulated by the reaction time and the amount of the tellurium containing compound. Specifically, in order to increase the molecular weight, the blending ratio of the tellurium containing compound with respect to the monomer may be reduced, and the polymerization time may be increased. However, this will require long time for obtaining the acrylic polymer (A) having the large molecular weight. Thus, in order to reduce the polymerization time, the polymerization temperature can be made higher, or said azo based polymerization initiator may be added. However, if the polymerization temperature is too high, or if the added amount of the azo based polymerization initiator is too much, the molecular weight distribution of the acrylic polymer (A) is increased, thus it will be necessary to regulate depending on these.

The blending ratio of the acrylic polymer (A) in the entire weight of the adhesive composition is preferably 35 to 90 wt %, more preferably 40 to 85 wt %, and further preferably 45 to 80 wt %. By controlling the blending amount of the acrylic polymer (A) as mentioned in above, the resilience of the adhesive composition before curing is enhanced, thus the deformation of the adhesive layer is reduced which is caused by the impact during the bonding in the production method of the semiconductor device wherein the wire bonding is carried out without curing the adhesive layer, thus the malfunction tends to be suppressed. Also, in case the ratio of the acrylic polymer (A) in such adhesive composition is large, the effect of the package reliability improvement of the present invention can be further enhanced by using the acrylic polymer (A) having the weight average molecular weight (Mw) of 350,000 or more and the molecular weight distribution (Mw/Mn) of 3 or less.

(B) Epoxy Based Heat Curable Resin

As the epoxy based heat curable resin, the conventionally known epoxy resin can be used. As the epoxy based heat curable resin (B), specifically the epoxy compound comprising two or more functional group in the molecule such as polyfunctional epoxy resin, biphenyl compound, bisphenol A diglycidylether or the hydrogenates thereof, orthocresol novolac epoxy resin, dicyclopentadiene type epoxy resin, biphenyl type epoxy resin, bisphenol A type epoxy resin, bisphenol F type epoxy resin, phenylene backbone type epoxy resin or so may be mentioned. These may be used alone or by combining two or more thereof.

In the adhesive composition, the epoxy based heat curable resin (B) is preferably included 1 to 100 parts by weight, more preferably by 3 to 70 parts by weight, and particularly by 5 to 50 parts by weight with respect to 100 parts by weight of the acrylic polymer (A). By setting the content of the epoxy based heat curable resin (B) within such range, sufficient adhesiveness is maintained and the resilience of the adhesive layer is maintained; and even before the curing, the deformation of the adhesive layer caused by the impact during the bonding at the wire bonding step scarcely occurs, thus the malfunction tends to be suppressed.

(C) Heat Curing Agent

The heat curing agent (C) functions as the curing agent against the epoxy based heat curable resin (B). As the preferable heat curing agent (C), the compound comprising two or more of the functional groups in one molecule capable of reacting with the epoxy group may be mentioned. As the functional group thereof, phenolic hydroxyl group, alcoholic hydroxyl group, amino group, carboxyl group and acid anhydrides or so may be mentioned. Among these, preferably phenolic hydroxyl group, amino group and acid anhydrides may be mentioned; and more preferably phenolic hydroxyl group, amino group may be mentioned. Further preferably, it is phenolic hydroxyl group and amino group.

As the specific example of the phenol based curing agent, polyfunctional phenol resin, biphenol, novolac type phenol resin, dicyclopentadiene based phenol resin, XYLOK type phenol resin, aralkyl phenol resin or so may be mentioned. As the specific examples of the amine based curing agent, DICY (dicyandiamide) may be mentioned. These may be used alone or two or more may be combined.

The content of the heat curing agent (C) in the adhesive composition is preferably 0.1 to 500 parts by weight, and more preferably 1 to 200 parts by weight with respect to 100 parts by weight of the epoxy based heat curable resin (B). If the content of the hat curing agent (C) is too little, the adhesiveness may be compromised due to insufficient curing; on the other hand if it is too much, the package reliability may be lowered due to the increased moisture absorption ratio of the adhesive layer.

(D) Cross-Linking Agent

The cross-linking agent (D) is preferably added to the adhesive composition. As the cross-linking agent (D), the organic polyvalent isocyanate compound, the organic polyvalent imine compound or so may be mentioned. By introducing the cross-linking structure, the reliability of the semiconductor wafer using the adhesive composition of the present invention improves. The living radical polymerization has a characteristic that the reaction at the active point is very mild compared to the free radical polymerization. That is, it is speculated that in the free radical polymerization, the reaction at the active point is very fast, thus the polymerization occurs from the monomer with higher reactivity, then the polymerization of the low reactivity occurs. On the other hand, it is thought that in the living radical polymerization, the reaction at the active point is very mild, thus the polymerization is carried out equally without the influence of the reactivity of the monomer, thereby forming the equal composition. As a result of the characteristic of said living radical polymerization, in case of using the monomer comprising the functional group which reacts with the cross-linking agent (D), the possibility of producing the molecule of the acrylic polymer (A) which does not substantially comprise the functional group reacting with the cross-linking agent (D) is reduced which is caused by the monomer comprising the functional group reacting with the cross-linking agent not taken into the polymer. Hence, even if the molecule of acrylic polymer (A) having the low molecular weight is present, it is highly likely that it will be taken into the three dimensional network structure due to the reaction between the cross-linking agent; thereby it is thought to lower the possibility of compromising the package reliability by the polymer having the low molecular weight which remained by not being taken into the three dimensional network structure.

As the above mentioned organic polyvalent isocyanate compound, aromatic polyvalent isocyanate compound, aliphatic polyvalent isocyanate compound, alicyclic polyvalent compound, and the trimer of these organic polyvalent isocyanates; and the terminal isocyanate urethane prepolymer or so may be mentioned which is obtained by reacting these organic polyvalent isocyanate and polyol.

As the organic polyvalent isocyanate compound, for example, 2,4-tolylene diisocyanate, 2,6-tolylene diisocyanate, 1,3-xylylene diisocyanate, 1,4-xylylene diisocyanate, diphenylmethane-4,4'-diisocyanate, diphenylmethane-2,4'-diisocyanate, 3-methyldiphenylmethane diisocyanate, hexamethylene diisocyanate, isophorone diisocyanate, dicyclohexylmethane-4,4'-diisocayanate, dicyclohexyl-2,4'-diisocyanate, lysine isocyanate, and the polyol adduct of these may be mentioned.

In case of using the isocyanate based cross-linking agent, the acrylic polymer (A) preferably comprises the hydroxyl group as the functional group which reacts with the cross-linking agent. When the cross-linking agent comprises the isocyanate group, and the acrylic polymer (A) comprises the hydroxyl group, the bonding between the acrylic polymer (A) and the cross-linking agent is easily formed due to the reaction between the isocyante group and the hydroxyl group, thus the cross-linking structure is easily introduced into the adhesive.

As for the above mentioned organic polyvalent imine compound, N,N'-diphenylmethane-4,4'-bis(1-aziridinecarboxyamide), trimethylolpropane-β-aziridinylpropionate, tetramethylolmethane-tri-β-aziridinylpropionate, and N,N'-toluene-2,4-bis(1-aziridinecarboxyamide) triethylene melamine or so may be mentioned.

In case of using the organic polyvalent imine compound as the cross-linking agent, the acrylic polymer (A) preferably comprises the carboxyl group as the functional group which reacts with the cross-linking agent, thereby the bonding between the acrylic polymer and the cross-linking agent is formed, thus the cross-linking structure is introduced into the adhesive.

In case of using the cross-linking agent (D), the cross-linking agent (D) is usually used in the proportion of 0.01 to 20 parts by weight, preferably 0.1 to 10 parts by weight and more preferably 0.5 to 5 parts by weight with respect to 100 parts by weight of the acrylic polymer (A).

Other Component

The adhesive composition can comprise following component in addition to the above mentioned components.

(E) Curing Catalyst

The curing catalyst (E) is used for regulating the curing speed of the adhesive composition. The curing catalyst (E) is preferably used particularly when using the epoxy based heat curable resin (B) and the heat curing agent (C) both.

As the preferable curing catalyst, tertiary amines such as triethylene diamine, benzyldimethyl amine, triethanol amine, dimethylamino ethanol, tris(dimethylaminomethyl) phenol or so; imidazols such as 2-methylimidazol, 2-phenylimidazol, 2-phenyl-4-methylimidazol, 2-phenyl-4,5-dihydroxymethylimidazol, 2-phenyl-4-methyl-5-hydroxymethylimidazol or so; organic phosphines such as tributylphosphine, diphenylphosphine, triphenylphosine or so; tetraphenyl boron salt such as tetraphenylphosphoniumtetraphenyl borate, triphenylphosphinetetraphenyl borate or so may be mentioned. These may be used alone or by mixing two or more thereof.

In case of using the curing catalyst (E), the curing catalyst (E) is included in the amount of preferably 0.01 to 10 parts by weight, more preferably 0.1 to 1 pars by weight with respect to 100 parts by weight of total of the epoxy based heat curable resin (B) and the heat curing agent (C). By comprising the curing catalyst within the above mentioned range, excellent adhesive characteristic can be obtained even when exposed to high temperature high humidity condition, and high package reliability can be attained even in case of exposed under harsh reflow condition. If the content of the curing catalyst (E) is too small, sufficient adhesive characteristic cannot be obtained due to the insufficient curing; on the other hand if it is too much, the curing catalyst having high polarity moves to the bonding boundary side in the adhesive layer under a high temperature high humidified condition, and the reliability of the semiconductor device declines due to the segregation.

(F) Energy Ray Polymerizable Compound

The energy ray polymerizable group may be blended to the adhesive composition. The energy ray polymerizable compound (F) includes the energy ray polymerizable group, and polymerizes and cures by receiving the energy ray irradiation such as electron beam or so. Specifically, as the energy ray polymerizable compound, acrylate based compounds such as trimethylolpropanetriacrylate, pentaerythritoltriacrylate, pentaerythritoltetraacrylate, dipentaerythritolmonohydroxypentaacrylate, dipentaerythritolhexaacrylate or 1,4-butyleneglycoldiacrylate, 1,6-hexanedioldiacrylate, polyethyleneglycoldiacrylate, oligoesteracrylate, urethaneacrylate based oligomer, epoxy modified acrylate, polyetheracrylate and itaconic acid oligomer or so may be mentioned. Such compound preferably comprises at least one polymerizable double bond in the molecule and usually the weight average molecular weight is 100 to 30000, and preferably 300 to 10000 or so. In case of using the energy ray polymerizable compound (F), the blending amount thereof is, although it is not particularly limited, used in the ratio preferably of 1 to 50 wt % or so with respect to 100 wt % of the entire amount of the solid portion of the adhesive composition.

(G) Photopolymerization Initiator

In case the adhesive composition comprises the aforementioned energy ray polymerizable compound (F), when using it, the energy ray polymerizable group compound is cured by irradiating the energy ray such as ultraviolet ray or so. At this time, by comprising the photopolymerization initiator in the adhesive layer, the polymerization time and the light irradiation amount can be reduced.

As the specific example of the photopolymerization initiator (G), benzophenone, acetophenone, benzoin, benzoin methylether, benzoin ethylether, benzoin isopropylether, benzoin isobutylether, benzoin benzoante, benzoin methyl benzoate, benzoin dimethylketal, 2,4-diethylthioxanthone, α-hydroxycyclohexyl phenyl ketone, benzyldiphenyl sulphide, tetramethylthiuram monosulphide, azobisbutyronitrile, benzyl, dibenzyl, diacetyl, 1,2-diphenylmethane, 2-hydroxy-2-methyl-1-[4-(1-methylvinyl)phenyl]propanone, 2,4,6-trimethylbenzoyldiphenylphosphineoxide, and β-chloroanthraquinone or so may be mentioned. The photopolymerization initiator (D) may be used alone or by combining two or more thereof.

In case of using the photopolymerization initiator (G), the blending ratio thereof is preferably 0.1 to 10 parts by weight and more preferably 1 to 5 parts by weight with respect to 100 parts by weight of the energy ray polymerizable compound (F). If it is less than 0.1 parts by weight, sufficient pickup property may not be obtained in some case due to insufficient photopolymerization; on the other hand if it exceeds 10 parts by weight, the residual products which does not contribute to the photopolymerization is generated, thereby the curability of the adhesive layer may be insufficient.

(H) Coupling Agent

The coupling agent (H) is the compound comprising the group capable of bonding with the organic compound and the group capable of reacting with the inorganic compound, and said coupling agent may be used for improving the adhesiveness and bonding property of the adhesive layer against the adherend. Also, by using the coupling agent (H), the water resistant property can be improved without compromising the heat resistance of the cured product obtained by curing the adhesive layer.

As the group of the coupling agent (H) capable of the bonding with the organic compound, it is preferably the group which reacts with the functional group comprised in the above mentioned acrylic polymer (A) and the epoxy based heat curable resin (B). As the coupling agent (H), silane coupling agent is preferable. As such coupling agent (H), γ-glycidoxypropyltrimethoxy silane, γ-glycidoxypropylmethyldiethoxy silane, β-(3,4-epoxycyclohexyl)ethyltrimethoxy silane, γ-(methacryloxypropyl)trimethoxy silane, γ-aminopropyltrimethoxy silane, N-6-(aminoethyl)-γ-aminopropyltrimethoxy silane, N-6-(aminoethyl)-γ-aminopropylmethyldiethoxy silane, N-phenyl-γ-aminopropyltrimethoxy silane, γ-ureidopropyltriethoxy silane, γ-melcaptopropyltrimethoxy silane, γ-melcaptopropylmethyldimethoxy silane, bis(3-triethoxysilylpropyl)tetrasulfan, methyltrimethoxy silane, methyltriethoxy silane, vinyltrimethoxy silane, vinyltriacetoxy silane, imidazole silane, 3-isocyanatepropylethoxy silane, isocyanate methylmethyldibutoxy silane, isocyanatemethyltriethoxy silane or so may be mentioned. These may be used alone or by combining two or more thereof.

In case of using the coupling agent (H), the coupling agent is included in the ratio of 0.1 to 20 parts by weight, preferably 0.2 to 10 parts by weight and more preferably 0.3 to 5 parts by weight with respect to 100 parts by weight of total of the acrylic polymer (A), the epoxy based heat curable resin (B) and the heat curing agent (C). If the content of the coupling agent (H) is less than 0.1 parts by weight, the above mentioned effect may not be obtained, and if it exceeds 20 parts by weight, it may become the cause of outgas.

(I) Inorganic Filler

By blending the inorganic filler (I) to the adhesive composition, the thermal expansion coefficient of the adhesive layer can be regulated, thus the package reliability can be improved by optimizing the thermal expansion coefficient of the adhesive layer of after the curing against the semiconductor chip or the metal, or against the organic substrate. Also, the moisture absorbing rate of after the curing of the adhesive layer can be reduced.

As for the preferable inorganic filler, powders such as silica, talc, calcium carbonate, titanium white, bengala, silicon carbide, boron nitride or so, a beads of which these has been made into spherical form, a single crystal fiber and glass fiber or so may be mentioned. Among these, silica filler is preferable. The above mentioned inorganic filler (I) may be used alone or by mixing two or more thereof. The content of the inorganic filler (I) is adjustable within the range of usually 0 to 80 parts by weight with respect to 100 parts by weight of the entire solid portion of the adhesive composition.

(J) General Additives

In the adhesive composition, other than the above mentioned, various additives may be blended if needed. As for such various additives, plasticizers, antistatic agents, antioxidants, pigments, colorings, gettering agents or so may be mentioned.

The adhesive layer comprising the adhesive composition comprising above mentioned each component has the pressure-sensitive adhesiveness and the heat curable property, further when it is under pre-cured condition, it has the function to temporary hold various adherend. Then, at the end, the cured product having high impact resistance can be provided by going through the heat curing, also has excellent shear strength, and can hold sufficient adhesive characteristic even under the harsh high temperature high humidified condition.

The adhesive layer may be a single layer adhesive sheet of which the above mentioned adhesive composition is made into a film, but the adhesive sheet wherein the adhesive layer comprising the above mentioned adhesive composition is formed on the support in a releasable manner is preferable.

(Adhesive Sheet)

Hereinafter, the preferable embodiment and use of the adhesive composition will be explained using the adhesive sheet wherein the adhesive layer comprising the above mentioned adhesive composition is formed on the support in a releasable manner as example. Upon using the adhesive sheet wherein the adhesive layer is formed on the support in a releasable manner, the adhesive layer is adhered to the adherend such as wafer or chip or so, and the adhesive layer is transferred to the adherend by releasing the support. The shape of the adhesive sheet according to the present invention can be any shape such as tape form, labeling form or so.

As the support of the adhesive sheet, for example, a film such as polyethylene film, polypropylene film, polybutene film, polybutadiene film, polymethylpentene film, polyvinyl chloride film, vinylchloride copolymer film, polyethylenetelephthalate film, polyethylenenaphthalate film, polybutylenetelephthalate film, polyurethane film, ethylene vinylacetate copolymer film, ionomer resin film, ethylene(meth) acrylic acid copolymer film, ethylene(meth)acrylic ester copolymer film, polystyrene film, polycarbonate film, polyimide film, fluororesin film or so may be used. Also, the crosslinked film thereof may be used. Further, it may be a stacked film thereof. Also, the colored film thereof can be used as well. The transparency of the support against the radiation such as ultraviolet ray or visible light or so can be selected depending on the use.

The adhesive sheet according to the present invention is laminated to various adherend, and then after the predetermined process is carried out to the adherend, the adhesive layer is released from the support while being adhered to the adherened. That is, the adhesive layer is used for the process including the step of transferring to the adherend from the support. Therefore, in case the adhesive treatment is not carried out to the support, the surface tension of the face contacting with the adhesive layer of the support is preferably 40 mN/m or less, more preferably 37 mN/m or less, and particularly preferably 35 mN/m or less. The lower limit is usually 25 mN/m or so. The support having such low surface tension can be obtained by suitably selecting the material, or it can be obtained by carrying out the release treatment by coating the release agent to the surface of the support.

As for the release agent used for the release treatment of the support, alkyd based, silicone based, fluorine based, unsaturated polyester based, polyolefin based, waxes or so may be used; however the release agent of alkyd based, silicone based, fluorine based are particularly preferable as they comprises the heat resistance.

In order to carry out the release treatment to the surface of the resin film by using the above mentioned release agent, the release agent is used as it is without solvent, by diluting with solvent or by emulsifying, and then coated using the gravure coater, mayer bar coater, air knife coater, roll coater or so; then cured under room temperature, or heat applying or electron beam curing, and the stacked body can be formed by wet lamination, dry lamination, thermofusion lamination, melt extrusion lamination, coextrusion processing or so.

The support may be the pressure sensitive adhesive sheet comprising the pressure sensitive adhesive layer. The pressure sensitive adhesive sheet comprises the pressure sensitive adhesive layer on the above mentioned resin film, and said adhesive layer is stacked on the pressure sensitive adhesive layer in a releasable manner. Therefore, the pressure sensitive adhesive layer of the pressure sensitive adhesive sheet can be constituted from the known pressure sensitive adhesive agent having releasable property; and the pressure sensitive adhesive agent of ultraviolet ray curing type, heat foaming type, water swelling type, and weak adhesive type can be selected; thereby the adhesive layer can be easily released.

Also, the adhesive sheet may have a shape wherein the support and the adhesive layer is cutout in advance in a same shape as the adherend (the semiconductor wafer or so) or cutout in a concentric circular shape larger than the wafer shape. Particularly, the stacked body comprising the support and the adhesive layer preferably has an embodiment being held on the lengthy support.

The thickness of the support is usually 10 to 500 preferably 15 to 300 and particularly preferably 20 to 250 μm or so. In case the support is the pressure sensitive adhesive sheet, usually within the thickness of the support, the pressure sensitive adhesive agent occupies the thickness of 1 to 50 μm or so. Also, the thickness of the adhesive layer is usually 2 to 500 preferably 6 to 300 and particularly 10 to 150 μm or so.

For the adhesive sheet, in order to protect the pressure sensitive adhesive layer of the adhesive layer before use, or to protect the pressure sensitive adhesive layer for fixing the jigs described in below, the release film may be stacked on the upper face of the adhesive layer. As the release film, those of which the release agent such as silicone resin or so are coated on the plastic material such as polyethylenetelephthalate film or polypropylene film or so is used. Also, at the outer peripheral part of the surface of the adhesive sheet, additional agglutinant layer or the agglutinant tape may be provided in order to fix other jigs such as ring flame or so.

The production method of the adhesive sheet is not particularly limited, and it may be produced by forming the adhesive layer by coating and drying the adhesive composition; also it may be produced by providing the adhesive layer on the release film for protecting the above mentioned adhesive layer, then transferring this to the above mentioned support.

Next, in regards with the method of use of the adhesive sheet according to the present invention, it will be explained taking the case of using the adhesive sheet to the production of the semiconductor device as an example.

(The Method for Producing the Semiconductor Device)

The production method of the semiconductor device according to the present invention comprises the steps of laminating the adhesive layer of the adhesive sheet to a semiconductor film, dicing said semiconductor wafer and the adhesive layer, thereby obtaining a semiconductor chip, releasing the semiconductor chip from the support while the adhesive layer is transferred to said semiconductor chip, and mounting said semiconductor chip on a die pad portion or on other semiconductor chip via said adhesive layer in case of stacking the chip.

Hereinafter, the production method of the semiconductor device according to the present invention will be described. In the production method of the semiconductor device according to the present invention, first, the semiconductor wafer is prepared wherein the circuit is formed on the front side and the backside has been ground.

The semiconductor wafer can be silicon wafer, or it may be a compound semiconductor wafer such as gallium aresenide. The circuit is formed on the wafer front side by various methods including the conventionally widely used method such as an etching method, a lift off method or so. Next, the opposite side (backside) of the circuit face of semiconductor wafer is ground. The grinding method is not particularly limited, and it may be ground by known means such as grinder or so. When carrying out the backside grinding, in order to protect the circuit on the front side, the pressure sensitive adhesive sheet so called front side protection sheet is laminated to the circuit surface. The backside grinding is carried out by fixing the circuit face side of the wafer (that is the front side protection sheet side) to the chuck table or so, and then the backside which is not formed with the circuit is ground by the grinder. The thickness after the wafer grinding is not particularly limited, however usually it is 20 to 500 μm or so.

Next, the ring frame and the backside of the semiconductor wafer are placed on the adhesive layer of the adhesive sheet according to the present invention, and then lightly pressed or in some case heat is applied to soften the adhesive layer; thereby the semiconductor wafer is fixed. Then, in case the energy ray polymerizable group (F) is blended in the adhesive layer, the energy ray is irradiated from the support side to the adhesive layer to cure the energy ray polymerizable compound (F), thereby the cohesion force of the adhesive layer is increased and the adhesive force between the adhesive layer and the support is lowered. As for the energy ray being irradiated, the ultraviolet ray (UV), or the electron beam (EB) or so may be mentioned; and preferably the ultraviolet ray is used. Next, by using the cutting means such as the dicing saw or so, the above mentioned semiconductor wafer is cut and the semiconductor chip is obtained. The depth of the cut is determined considering the total of the thickness of the semiconductor wafer and the thickness of the adhesive layer, and also the abrasion of the dicing saw; and the adhesive layer is also cut as the same size as the chip. Note that, the energy ray irradiation may be carried out any time between after the semiconductor wafer is laminated and before the semiconductor chip is released (pickup); and for example, it may be carried out after the dicing and it may be carried out after the following described expanding step. Further, the energy ray irradiation can be carried out in plurality of times.

Next, if needed, by carrying out the expanding of the adhesive sheet, the space between the semiconductor chips is made wider; thereby the pickup of the semiconductor chip can be carried out easily. At this time, the adhesive layer and the support slides against each other and the adhesive force between the adhesive layer and the support declines, thereby the pickup property of the semiconductor chip improves. By carrying out the pickup of the semiconductor chip as such, the semiconductor chip can be released from the support while the adhesive layer being cut is transferred on the backside of the semiconductor chip.

Next, the semiconductor chip is placed on the surface of the die pad of the lead frame or on other semiconductor chip (lower chip) which is the chip mounting part. The chip mounting part is applied with heat prior to or after mounting the semiconductor chip in order to enhance the adhesiveness of the adhesive layer. The heating temperature is usually 80 to 200° C., preferably 100 to 180° C.; and the heating time is usually 0.1 seconds to 5 minutes, and preferably 0.5 seconds to 3 minutes. Also, the pressure when placing the chip is usually 1 kPa to 200 MPa.

After the chip mounting part is mounted on the semiconductor chip, the through-curing of the adhesive layer using the heat applying at the resin sealing which will be described in below does not have to be carried out, and the adhesive layer may be through-cured by applying the heat prior to the resin sealing. The heat applying condition at this time is within the range of the above mentioned heat applying temperature, and the heat applying time is usually 1 to 180 minutes, and preferably 10 to 120 minutes.

Also, after the mounting, it may be temporary adhered without carrying out the heat applying treatment, and the adhesive layer may be cured by using the heat applying of the resin sealing which is usually carried out at the package production. By going through such steps, the adhesive layer is cured, and the semiconductor chip and the chip mounting part can be strongly adhered. The adhesive layer is fluidized under the die bonding condition, thus it is embedded into the roughness of the chip mounting portion, and the void is prevented from being generated thus the package reliability increases. In this case, the semiconductor chip mounted on the chip mounting part via the adhesive layer will go through the wire bonding step while the adhesive layer is pre-cured. When such process is employed, due to the heat applying during the wire bonding, the reaction of the component which contributes to the heat curing of the adhesive layer will partially proceed, and the package reliability of the semiconductor device may be at a risk. However, by using the adhesive composition of the present invention, the adhesiveness of the adhesive layer to the chip is improved, and the package reliability tends to be maintained.

The adhesive composition and the adhesive sheet of the present invention can be used for the adhering the semiconductor compounds, glasses, ceramics, metals or so in addition to the above mentioned method of use.

EXAMPLES

Hereinafter, the present invention will be explained using the examples; however the present invention is not to be limited thereto. Note that, in the below examples and the comparative examples, "GPC measurement" and "IR reflow resistance property evaluation" were carried out as described in below.

<GPC Measurement>

For the acrylic polymer used in each example, the weight average molecular weight Mw and the number average molecular weight Mn in terms of the polystyrene standard were measured using the gel permeation chromatography (GPC) method; and the molecular weight distribution (Mw/Mn) was obtained from the measured value.

The measuring device: the high speed GPC device "HLC-8120GPC" made by TOSOH CORPORATION was connected with the high speed GPC column "TSK gurd column $H_{xL}$-H", "TSK Gel $GMH_{xL}$", "TSK Gel G2000 $H_{xL}$" (all made by TOSOH CORPORATION) in this order.

The column temperature: 40° C., the liquid sending speed: 1.0 mL/min, and the detector: the differential refractometer.

<IR Reflow Resistance Property Evaluation>

(The Production of the Semiconductor Chip)

To the brushed face of the silicon wafer (the diameter of 150 mm, the thickness of 75 μm) finished with dry polishing, the lamination of the adhesive sheet of the examples and the comparative examples were carried out by the tape mounter (Adwill RAD 2500 made by Lintec Corporation) thereby it was fixed to the ring frame for wafer dicing. Next, by using the dicing device (DFD651 made by DISCO Corporation), the chip was diced into the size of 8 mm×8 mm. The cut during the dicing was 20 μm into the support.

(The Production of the Semiconductor Package)

The substrate (LN001E-001 PCB (Au) AUS303 made by CHINO GIKEN CORPORATION) comprising the circuit pattern formed on the copper foil (18 μm thickness) of the copper clad laminates (CCL-HL830 made by MITSUBISHI GAS CHEMICAL COMPANY. INC), and comprising a solder resist (PSR-4000 AUS303 made by TAIYO INK MFG. CO. LTD) on the pattern was used as the substrate. The chip on the adhesive sheet obtained in the above was taken out together with the adhesive layer from the support, and pressure adhered on the substrate at 120° C., 250 gf, for 0.5 second via the adhesive layer, then the pressure adhering was carried out under the same condition on the chip via the adhesive agent. Then, it was sealed (the sealing device MPC-06M TriAl Press made by APIC YAMADA CORPORATION) using the mold resin (KE-1100AS3 made by KYOCERA CHEMICAL CORPORATION) so that the sealed thickness was 400 then the resin was cured at 175° C. for 5 hours. Then, the substrate being sealed was laminated to the dicing tape (Adwill D-510T made by Lintec Corporation), and it was diced into the size of 8 mm×8 mm using the dicing device (DFD651 made by DISCO Corporation), thereby the semiconductor package for the reliability evaluation was obtained.

(The Evaluation of the Surface Mounting Property of the Semiconductor Package)

The obtained semiconductor package was left for 168 hours at 85° C. and the humidity of 60% RH to allow absorbing the moisture, then IR reflow (Reflow furnace: WL-15-20DNX type made by Sagami Rikou Co., Ltd.) of heating time of 1 minute at the maximum temperature of 260° C. was carried out for three times; and the presence of the peeling at the bonding part, the presence of the package crack were evaluated by the scanning ultrasonic flow detection device (Hye-Focus made by Hitachi Construction Machinery Co., Ltd) and by the cross section observation. When the peeling of 0.5 mm or longer was observed at the bonding part of the semiconductor chip, it was determined as "poor product", and 27 packages were introduced into the test and the number of "good product" was counted.

<The Synthesis Example of the Acrylic Polymer by TERP Method>

Methylacrylate (MA, made by TOKYO CHEMICAL INDUSTRY CO., LTD) and 2-hydroxyethylacrylate (HEA, made by TOKYO CHEMICAL INDUSTRY CO., LTD) as the monomers were used in the proportion of the weight ratio of 95:5, and the polymerization was carried out as in below; thereby the acrylic polymer (A-1) comprising the random copolymer of MA/HEA was produced. First, in the glovebox substituted by Argon, 37.7 µL of ethyl-2-methyl-2-n-butyltellanyl-propionate, 133 g of methylacrylate (same as the above), 7.0 g of 2-hydroxyethylacrylate (same as the above) and 8.1 mg of 2,2'-azobis(isobutylnitrile) (AIBN, made by Otsuka Chemical Co., Ltd) were reacted at 60° C. for 20 hours.

After completing the reaction, the reaction container was taken out from the glovebox, and dissolved in 500 ml of ethyl acetate, and then this polymer solution was passed through the column made of activated alumina [made by Wako Pure Chemical Industries, Ltd]. Ethyl acetate was added so that the viscosity of this polymer solution becomes 10,000 mPa·s (25° C.). The solid portion of the obtained polymer was 17.3 wt %. The acrylic polymers (A-2), (A-3) and (A-5) were produced by the living radical polymerization as same as the acrylic polymer (A-1) except for regulating the added amount and the polymerization time of ethyl-2-methyl-2-n-butyltellanyl-propionate and AIBN.

<The Adhesive Composition>

Each component constituting the adhesive composition is shown in below.

(A) Acrylic polymer:

(A-1) to (A-3) The acrylic polymers having the weight average molecular weight and the molecular distribution shown in Table 2 produced by the synthesis example of the above mentioned.

(A-4) The acrylic polymer having the weight average molecular weight and the molecular distribution shown in Table 2 produced by the free radical polymerization method and using the same types and the weight ratio of the monomers as (A-1).

(A-5) The acrylic polymer having the weight average molecular weight and the molecular distribution shown in Table 2 produced by the synthesis example using the above mentioned TERP method.

(A-6), (A-7) The acrylic polymers having the weight average molecular weight and the molecular distribution shown in Table 2 produced by the free radical polymerization method and using the same types and the weight ratio of the monomers as (A-1).

(B) Epoxy based heat curable compound; Bisphenol A type epoxy resin (EPOKOTE 828 made by Japan Epoxy Resin Corporation, epoxy equivalent 189 g/eq)

(C) Heat curing agent; Novolac type phenol resin (Shonol BRG-556 made by Showa Highpolymer Co., Ltd, phenolic hydroxyl group equivalent 104 g/eq)

(D) Cross-linking agent; Aromatic polyisocyanate (CORONATE L made by NIPPON POLYURETHANE INDUSTRY Co., Ltd.)

(E) Curing catalyst; Imidazol (Curezol 2PHZ made by SHIKOKU CHEMICALS CORPORATION)

(H) Coupling agent; Silane coupling agent (MKC silicate MSEP2 made by Mitsubishi Chemical Corporation)

(I-1) Inorganic filler; silicazol MEK-ST made by NISSAN CHEMICAL INDUSTIRES, LTD.

(I-2) Inorganic filler; MEK-AC-4101 made by NISSAN CHEMICAL INDUSTIRES, LTD.

(The Examples and Comparative Examples)

(The Adhesive Layer)

Each component described in the above was blended in the amount shown in Table 1, thereby the adhesive composition was obtained. The methylethylketone solution of the obtained composition (the solid concentration of 61 wt %) was coated and dried (drying condition: 100° C. for 1 minute in the oven) on the release treated face of the release film (SP-PET381031 made by Lintec Corporation) release treated with silicone so that the thickness after the drying is 10 µm; then it was laminated against the support (polyethylene film, the thickness of 100 µm, the surface tension of 33 mN/m); and the adhesive sheet was obtained by transferring the adhesive layer to the support. The IR reflow resistance evaluation result is shown in Table 2.

TABLE 1

| Component | Example 1 | Example 2 | Example 3 | Example 4 | Example 5 | Example 6 | Comparative example 1 | Comparative example 2 | Comparative example 3 | Comparative example 4 | Comparative example 5 |
|---|---|---|---|---|---|---|---|---|---|---|---|
| A-1 | 250 | | | | 250 | 250 | | | | | |
| A-2 | | 250 | | | | | | | | | |
| A-3 | | | 250 | 250 | | | | | | | |
| A-4 | | | | | | | 250 | | 250 | | |
| A-5 | | | | | | | | 250 | | | |
| A-6 | | | | | | | | | | 250 | |
| A-7 | | | | | | | | | | | 250 |
| B | 64.5 | 64.5 | 64.5 | 64.5 | 64.5 | 64.5 | 64.5 | 64.5 | 64.5 | 64.5 | 64.5 |
| C | 35.5 | 35.5 | 35.5 | 35.5 | 35.5 | 35.5 | 35.5 | 35.5 | 35.5 | 35.5 | 35.5 |
| D | 3 | 3 | 3 | 0 | 3 | 3 | 3 | 3 | 0 | 3 | 3 |
| E | 1 | 1 | 1 | 1 | 1 | 1 | 1 | 1 | 1 | 1 | 1 |
| H | 3 | 3 | 3 | 3 | 3 | 3 | 3 | 3 | 3 | 3 | 3 |
| I-1 | | | | | 153 | | | | | | |
| I-2 | | | | | | 153 | | | | | |

Unit: parts by weight (in terms of solid portion)

TABLE 2

| | Acrylic polymer | Corss-linking agnet | Mw | Mw/Mn | IR reflow resistance evaluation |
|---|---|---|---|---|---|
| Example 1 | A-1 | used | 680,000 | 2 | 27/27 |
| Example 2 | A-2 | used | 520,000 | 1.8 | 27/27 |
| Example 3 | A-3 | used | 450,000 | 1.3 | 27/27 |
| Example 4 | A-3 | none | 450,000 | 1.3 | 21/27 |
| Example 5 | A-1 | used | 680,000 | 2 | 27/27 |
| Example 6 | A-1 | used | 680,000 | 2 | 27/27 |
| Comparative example 1 | A-4 | used | 420,000 | 4.2 | 13/27 |

TABLE 2-continued

|  | Acrylic polymer | Corss-linking agnet | Mw | Mw/Mn | IR reflow resistance evaluation |
|---|---|---|---|---|---|
| Comparative example 2 | A-5 | used | 130,000 | 1.3 | 0/27 |
| Comparative example 3 | A-4 | none | 420,000 | 4.2 | 0/27 |
| Comparative example 4 | A-6 | used | 270,000 | 2.4 | 15/27 |
| Comparative example 5 | A-7 | used | 330,000 | 3.3 | 15/27 |

The invention claimed is:

1. A method for producing an adhesive composition comprising:
   obtaining an acrylic polymer (A) having a weight average molecular weight of 350,000 or more by polymerizing an acrylic monomer by a living radical polymerization method using an organic tellurium compound as a polymerization initiator; and
   blending an epoxy based heat curable resin (B) and a heat curing compound (C) for the epoxy based heat curable resin (B).

2. The method for producing an adhesive composition as set forth in claim 1, wherein the adhesive composition further comprises a cross-linking agent (D), and said acrylic polymer (A) comprises a functional group which reacts with said cross-linking agent.

3. The method for producing the adhesive composition as set forth in claim 2, wherein the cross-linking agent (D) comprises an isocyanate group, and the acrylic polymer (A) comprises a hydroxyl group.

4. The method for producing an adhesive composition as set forth in claim 2, wherein the cross-linking agent (D) comprises an organic polyvalent imine compound.

5. The method for producing the adhesive composition as set forth in claim 1, wherein the weight average molecular weight of the acrylic polymer (A) is 350,000 to 900,000.

6. The method for producing an adhesive composition as set forth in claim 1, wherein the adhesive composition further comprises a cross-linking agent (D) comprising an isocyanate group.

7. The method for producing an adhesive composition as set forth in claim 1, wherein the heat curing compound (C) has two or more phenolic hydroxy groups.

8. The method for producing an adhesive composition as set forth in claim 1, wherein the acrylic polymer (A) has a weight average molecular weight of 350,000 to 520,000.

9. The method for producing an adhesive composition as set forth in claim 1 comprising:
   40-80 wt. % acrylic polymer (A);
   5-90 parts by weight of the epoxy based heat curable resin (B) based on 100 parts by weight of the acrylic polymer (A); and
   1-200 parts by weight of the heat curing compound (C) based on 100 parts by weight of the epoxy based heat curable resin (B).

10. The method for producing an adhesive composition as set forth in claim 1, wherein the polymerization is carried out without solvent.

11. The method for producing an adhesive composition as set forth in claim 1, wherein the acrylic polymer (A) has a weight average molecular weight of 350,000 to 900,000 and a molecular weight distribution, Mw/Mn, of 2 or less.

12. The method for producing an adhesive composition as set forth in claim 1, wherein the epoxy based heat curable resin (B) comprises an orthocresol novolac epoxy resin, dicyclopentadiene epoxy resin, or bisphenol F epoxy resin.

* * * * *